United States Patent [19]

Feilchenfeld et al.

[11] Patent Number: 5,798,563
[45] Date of Patent: Aug. 25, 1998

[54] POLYTETRAFLUOROETHYLENE THIN FILM CHIP CARRIER

[75] Inventors: Natalie Barbara Feilchenfeld, Endwell; John Steven Kresge, Binghamton; Scott Preston Moore, Apalachin; Ronald Peter Nowak, Endicott; James Warren Wilson, Vestal, all of N.Y.

[73] Assignee: International Business Machines Corporation, Armonk, N.Y.

[21] Appl. No.: 790,245

[22] Filed: Jan. 28, 1997

[51] Int. Cl.$^6$ .......................... H01L 23/495; H01L 23/04; H01L 23/48; H01L 23/52
[52] U.S. Cl. .......................... 257/668; 257/700; 257/702; 257/698; 257/759; 257/642; 438/125; 361/795; 174/255
[58] Field of Search .......................... 257/668, 700, 257/702, 703, 705, 698, 759, 642; 438/125, 126, 375, 376, 377, 378, 379; 361/748, 792, 793, 795; 174/255, 260, 261

[56] References Cited

U.S. PATENT DOCUMENTS

| | | | |
|---|---|---|---|
| 4,665,468 | 5/1987 | Dohya | 361/414 |
| 4,847,146 | 7/1989 | Yeh et al. | 428/332 |
| 4,849,284 | 7/1989 | Arthur et al. | 428/325 |
| 4,965,702 | 10/1990 | Lott et al. | 361/481 |
| 5,194,713 | 3/1993 | Egitto et al. | 219/121 |
| 5,249,101 | 9/1993 | Frey et al. | 257/706 |
| 5,264,664 | 11/1993 | McAllister et al. | 174/261 |
| 5,375,042 | 12/1994 | Arima et al. | 361/784 |
| 5,432,677 | 7/1995 | Mowatt et al. | 361/719 |
| 5,525,834 | 6/1996 | Fischer et al. | 257/691 |

OTHER PUBLICATIONS

"High Performance, Organic Single Chip Package" by Petefish, et al., Proceedings 1996 International Symposium on Microelectronics (SPIE) vol. 2920, Oct. 1996, pp. 249-253.

*Primary Examiner*—Mahshid D. Saadat
*Assistant Examiner*—Jhihan B. Clark
*Attorney, Agent, or Firm*—Calfee, Halter & Griswold LLP

[57] ABSTRACT

The present invention provides an organic chip carrier particularly useful with flip chips, comprising an organic dielectric layer, a first layer of circuitry disposed on the dielectric layer, an organic conformational coating disposed over the first layer of dielectric and the first layer of circuitry, and a layer of fine line circuitry having line width of about 2.0 mil or less, preferably about 1.0 mil or less, preferably about 0.7 mil, and a space between lines of about 1.5 mil or less, preferably about 1.1 mil or less, disposed on the conformational layer. Preferably the dielectric layer is free of woven fiber glass. The conformational coating preferably has a dielectric constant of about 1.5 to about 3.5, and a percent planarization of greater than about 3.5% The invention also relates to methods of making the dielectric coated chip carrier.

22 Claims, 2 Drawing Sheets

POLYTETRAFLUOROETHYLENE THIN FILM CHIP CARRIER

BACKGROUND OF THE INVENTION

In the field of chip carriers, it is desirable to have carriers with fine line circuitry, that is, circuitry having 2.0 mil wide lines or narrower, with less than a 2.5 mil/ space between lines. Fine line circuitry permits high wireability which reduces the need for extra layers within the carrier, and supports dense chip arrays. Such fine line resolution has been achievable in ceramic carriers; however, such resolution has not been obtainable with conventional organic carriers.

It would be desirable to have an organic carrier with fast signal speed, low dielectric constant and fine line circuitry.

SUMMARY OF THE INVENTION

The present invention provides an organic chip carrier particularly useful with flip chips, comprising an organic dielectric layer, a first layer of circuitry disposed on the dielectric layer, an organic conformational coating disposed over the first layer of dielectric and the first layer of circuitry, and a layer of fine line circuitry having line width of about 2.0 mil or less, preferably about 1.0 mil or less, preferably about 0.7 mil, and a space between lines of about 1.5 mil or less, preferably about 1.1 mil, disposed on the conformational layer. Preferably the dielectric layer is free of woven fiber glass. The conformational coating preferably has a dielectric constant of about 1.5 to about 3.5, and a percent planarization of greater than about 30%. The invention also relates to methods of making the dielectric coated chip carrier.

DETAILED DESCRIPTION OF THE INVENTION

The present invention provides an organic chip carrier particularly useful with flip chips, which preferably has a dielectric constant of about 2 to 3, which achieves line width of less than 2.5 mil, preferably about 0.7 mil, with space between lines of less than 2.3 mil preferably about 1.1 mil. The carriers are capable of carrying at least 500 to 800 signal I/O's (input/output). Preferably the carrier has a coefficient of thermal expansion of about 10 to about 23 ppm/°C., more preferably about 10 to 15 ppm/°C. Preferably the carrier lacks a ceramic layer.

Figure 1:
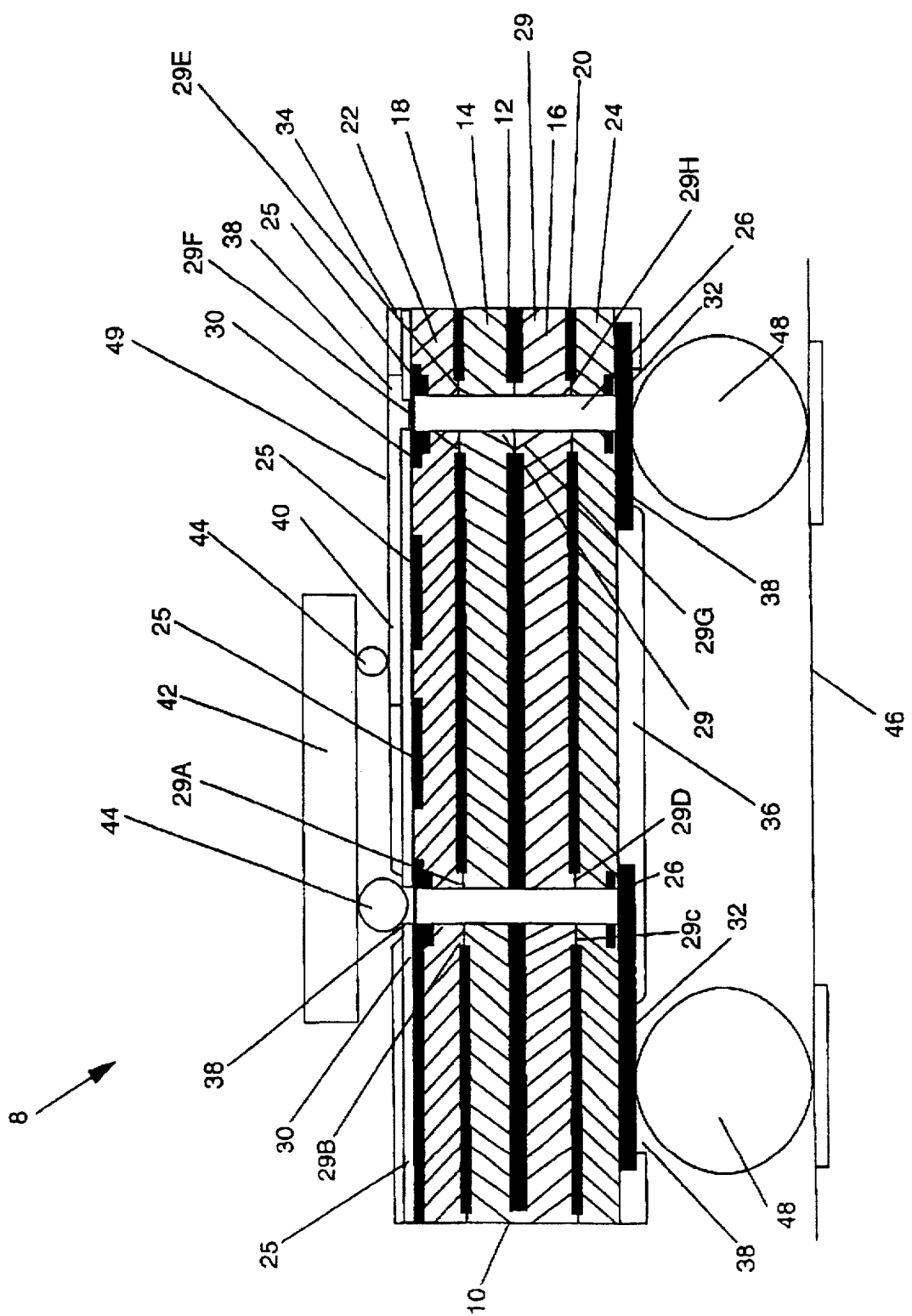
FIG. 1 is a cross section of an embodiment of an organic carrier mounting an I/C chip and mounted on a substrate according to the present invention.

Referring to FIG. 1, a cross section of an embodiment of the invention is shown. A circuitized structure 8 is provided which includes a carrier 10. The carrier 10 is comprised of a compensator layer 12 (which will be described in detail below) and a first inner dielectric layer 14 laminated to one side of the compensator layer 12 and a second inner dielectric layer 16 laminated to the other side of the compensator layer 12. A first ground or power plane 18 is disposed on the first inner dielectric layer 14 and a second ground or power plane 20 disposed on one side of the second inner dielectric layer 16. Disposed on one side of first ground plane 18 is first dielectric layer 22. A second dielectric layer 24 is disposed on one side of the second ground plane 20. A layer of circuitry 25 is disposed on the first dielectric layer 22. Through holes 26, which are plated with conductive plating 28, are disposed in carrier 10. (Alternatively, through holes 26 can be filled with conductive fill). Through holes 26 are blind or extended through the carrier 10. Clearance holes 29 prevent contact between compensator 12 and the plating 28 on the walls of the through holes 26. Clearance holes 29a–29h also isolate the ground planes and power planes 18 and 20 from through holes 26 as needed for the circuitry design. Pads 30 and 32 are disposed over ends of through holes 26.

Conformational coating 34 is disposed on first dielectric layer 22, optionally conformational coating 36 is disposed on dielectric layer 24. At least one, preferably a plurality of vias 38 are disposed in conformational coating 34 and 36. Vias 38 connect to pads 30 and 32 and to circuitry 25. Fine line circuitry 40 is disposed on conformational coating 34, to provide a circuitized carrier which has a dielectric constant of about 2 to 3, which achieves line width of 1 mil or less, preferably 0.7 mil or less, with line spacing of 1.5 or less, preferably 1.1 mil or less. optionally, an additional coating of dielectric is disposed over the circuitry 40 on conformational coating 34. Chip 42 is attached to fine line circuitry 40. Solder balls 44 connect the chip 42 to the fine line circuitry 40, pads 30, and circuitry 25. Vias 38 are plated or filled.

Carrier 10 is attached to substrate 46, preferably by ball grid arrays 48. Suitable substrates include, for example, circuitized substrates, such as circuit boards, cards, carriers, organic and inorganic single chip modules, organic or inorganic multi-chip modules, and ceramic carriers.

Preferably the compensator 12 is stiff to provide the carrier 10 with rigidity. Preferred compensators are three layered structures comprised of a first layer of copper, a second layer of 36% nickel-63% iron alloy (which has a coefficient of thermal expansion (CTE) of close to zero in the operating layer of the carrier), and a third layer of copper. Preferably the compensator comprises 75% of a 36% nickel-63% iron alloy, and 25% copper. A suitable 36% nickel-63% iron alloy is available under the trademark Invar®, from Texas Instruments. Alternatively, the compensator is formed of a single metal such as invar. The choice of the material for the compensator, together with the choice of material for the dielectric, will control the coefficient of thermal expansion (CTE) of the carrier 10. Preferably the compensator has a thickness of from about 0.001 to about 0.009 inches, preferably about 0.006 inches. The ground planes 18, 20 can be formed of copper or CIC or other conductor material as is well known.

Figure 2:
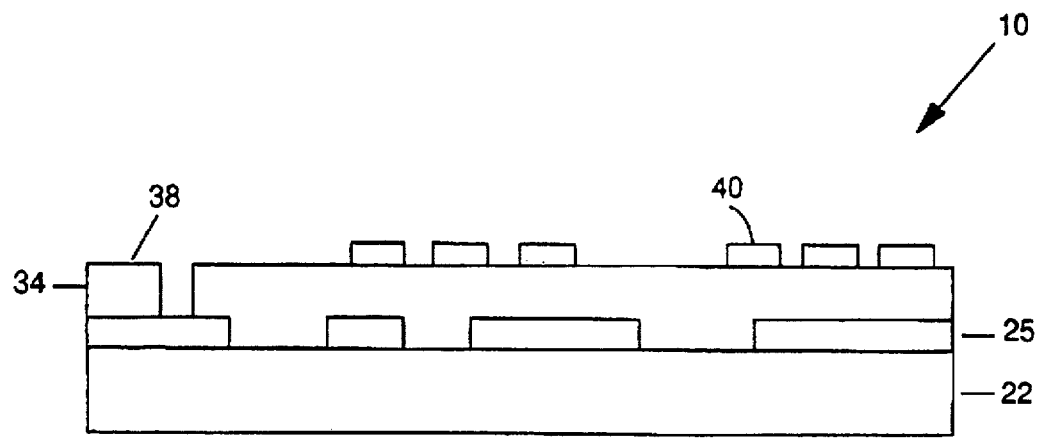
FIG. 2 is a cross section of an organic carrier for carrying an I/C chip and for mounting to a circuit board according to another embodiment of the present invention.

Referring to FIG. 2, a cross section of another embodiment of the invention, is shown. The carrier 10 is multi-layered and is comprised of a dielectric layer 22, again preferably polytetrafluoroethylene, a first layer of circuitry 25 disposed on the dielectric layer 22, an organic conformational coating 34, again preferably polyimide, disposed over the layer of dielectric 22 and the first layer of circuitry 25, and a second layer of circuitry 40, the fine layer circuitry, having line width of about 1.0 mil or less, preferably about 0.7 mil, and a space between lines of about 1.5 mil or less, preferably about 1.1 mil, or less, disposed on the conformational layer 34. All the necessary vias and through holes needed for electrical connections are not shown; only via 38 is shown. A chip, (not shown), is attached to the second layer of circuitry 40 and the carrier 10 is attached to a substrate (also not shown). The carrier 10 is suitable for attachment to substrates and to other carriers.

The Dielectric Layer

The dielectric layer is composed of a organic polymeric material and preferably filled with a particulate material. The dielectric constant of the dielectric layer is preferably from about 1.5 to 3.5, more preferably 2 to about 3. The thickness of the filled dielectric layers varies according to the desired design performance characteristics of the carrier. The dielectric does not contain woven fiberglass; such absence of woven fiberglass enables through holes to be closely spaced. Indeed spacing less than 100 mils, preferably less than 50 mils, more preferably 25 mils most preferably less than 10 mils between centers, is achievable without shorting between the through holes. The coefficient of thermal expansion of the dielectric layer is preferably from about 20 to 80 ppm/°C., more preferably from about 20 to 30 ppm/°C. Preferably the particulate filler has a diameter less than about 10 μm, more preferably from about 5 to about 8 μm. Preferably the particulate filler is present from about 30 to about 70 percent by weight, more preferably from about 40 to about 60 percent by weight. Preferably the particulate is silica. Suitable materials for the dielectric layer include, for example, cyanate ester and polytetrafluoroethylene. Suitable cyanate ester is available under the tradename Speedboard® from Gore in Eau Claire, Wisconsin. Suitable polytetrafluoroethylene is available under the trade name "Teflon®". Suitable silica filled polytetrafluoroethylene is available as HT 2800 from Rogers Corporation.

The Conformational Coating

The conformational coating has a percent planarization which is 30% or greater; techniques for measuring percent planarization are found in "Polymer Dielectric for multi-chip Module packaging", Philip Garrou, The Proceedings IEEE, volume 80, 12, Dec. 1992, pp. 1942–1954. The conformational coating is characterized in that the bottom surface of the dielectric conforms to the surface topology of the dielectric layer, yet the top surface of the conformational coating does not conform and is relatively planar. The dielectric constant of the conformational coating is preferably from about 1.5 to 3.5, more preferably 2.8 to 3.6, most preferably about 2.9 to about 3.

The conformational coating is permanent and is not stripped; however, a portion of the conformational coating is removed, by conventional techniques, such as by ablation, photopatterning and chemical etching, to allow electrical connections to extend from the outer surface of the conformational coating 34 to the first layer of circuitry 25. Preferably the conformational coating is thermally stable for at least 3 cycles at 350°C. for five minutes, and metal deposition for about 30 minutes, more preferably about 60 minutes, at 400°C., which are typical temperatures employed in chip attachment and metal deposition process. The conformational coating is preferably substantially free of ions and particulates, including for example metal. Preferably, the conformational coating has a coefficient of thermal expansion of: from about 1 ppm/°C. to about 50 ppm/°C., more preferably from about 10 to 20 ppm/°C. in the x-y direction, and about 15 to 40, more preferably from about 20 to 30 ppm/°C., in the z direction. The conformational coating preferably forms thin layers about 8 microns or less.

The conformational coating has an additional advantage in that it protects the first dielectric layer from attack from process chemicals used in the circuitization process such as, for example, dodecyl benzene sulfonic acid. The conformational coating eliminates the need for a solder mask during the metallization stage since the conformational coating also functions as a solder mask.

Suitable conformational coatings include, for example, polyimides and benzocyclobutene. Benzocyclobutene is available from Dow Chemical Company, under the trade name Cyclotene. A suitable polyimide is available as du Pont 5878 polyimide from E.I. du Pont de Nemours and Company. The du Pont 5878 has a coefficient of thermal expansion of 16 ppm°C. in the x-y direction and 24 ppm°C. in the z direction, a dielectric constant of 2.9 and a tensile modulus of 0.1 psi. Another suitable polyimide is a photosensitive polyimide commercially available under the tradename Ultradel 510 from Amoco Chemical Company, Alpharetta, Ga. Polyimides can be rendered photosensitive by the methods described in "Polymer Dielectrics for multi-chip Module packaging", Philip Garrou, The Proceedings IEEE volume 80, 12, Dec. 1992, pp. 1942–1954, which is specifically incorporated herein.

The chip carrier of the present invention, particularly a multi-layer structure having a compensator, dielectric and power planes, is manufactured according to the following steps. A dielectric layer having a dielectric constant of from about 1.5 to 3.5 is provided, and a first layer of circuitry is formed in the dielectric layer using conventional techniques, including for example, lamination, vacuum deposition, evaporation, sputtering, seeding followed by electroless plating, plating, electron beam deposition, laser deposition or by vacuum deposition followed by electroplating.

Then, a conformational coating having a percent planarization of greater than about 30 percent, is applied to the surface of the dielectric layer. The conformational coating is applied to a thickness of preferably less than one mil, more preferably about 4 microns to about 8 microns, preferably about 6 microns. At least one via is defined in the conformational coating, employing conventional techniques such as by ablation, chemical etching or photoimaging. Then fine line circuitry wherein the fine lines have a line width less than 1 mil and line spacing of 1.5 mil or less, is formed on the conformational coating by employing conventional techniques such as, for example, vacuum deposition, evaporation or sputtering, seeding followed by electroless plating, or by vacuum deposition followed by electroplating. The circuitry is then defined, such as by subtractive etching. Optionally, a second conformational coating is applied over the fine line circuitry so that the circuitry is imbedded in the conformational coating.

The various materials, and thickness of the various materials, are selected such that among other properties, the resultant chip carrier will have a CTE of about 6 to about 14, and preferably about 8 to about 12.

The following Examples are intended to be illustrative and not in any way limit the scope of the invention.

EXAMPLE 1

A multi-layered structure comprising a first layer of polytetrafluoroethylene dielectric 22, a ground or power plane 18, a first inner layer of polytetrafluoroethylene dielectric 14, a compensator 12, a second inner layer polytetrafluoroethylene dielectric 16, a ground or power plane 20, and a second polytetrafluoroethylene dielectric layer 24 was assembled. The carrier 10 was prepared as follows: a sandwich was assembled containing: as the top layer a first 0.7 mil copper sheet; a 2 mil filled polytetrafluoroethylene sheet 14 from Rogers, designated 2800 HT; a copper -invar -copper compensator 12 from Texas Instruments; a 2 mil polytetrafluoroethylene sheet 16; and a second 0.7 mil copper sheet as the bottom of the sandwich. The compensator 12 was patterned to provide clearance holes. The sandwich structure was placed in a lamination press, from TMP, Inc. for about five hours at 700° F. and cooled. The copper sheets on the outside of the sandwich structure were patterned by conventional methods to form copper ground planes 18 and 20. Next, a 1.5 mil sheet of polytetrafluoroethylene 22 and 24 was placed on the exposed sides of the copper ground planes 18 and 20 and copper sheets were then placed on the exposed side of polytetrafluoroethylene 22 and 24 and placed in the lamination press for about 5 hours at 700° F., to provide copper clad laminate. Through holes 26, about 6 mil in diameter, were mechanically drilled at a spacing of 18 mils, on center, through the copper clad laminate and plated with plating 28, preferably copper plating, using conventional techniques.

The through holes 26 were then capped on both ends with pads 30 and 32 in the following way. The copper plated through holes 26 and lands on the surfaces to be capped were plated with gold. A sheet of copper was plated with a Au and Sn pattern of dots that match the position of through holes 26 on the multi-layer structure. The multi-layer structure and sheet were aligned, and laminated at a temperature of about 300° to 400° C. As a result, the plated through holes 26 and the Au Sn dots fused together. The sheet is then subtractively patterned to leave "man-hole" covers, that is pads over the plated through holes 26.

Polyamic acid designated Dupont 5878 from Dupont Chemical Company, was diluted with n-methyl-pyrillidone to a viscosity suitable for spray application. The capped laminate substrate was then sprayed one side at a time, with the polyamic acid to provide a polyamic acid coating of about 8 to 10 microns, and dried in an oven for about 30 minutes at 100° C. to evaporate the solvent. The thickness of the coating 34 was about 6 microns after drying. The substrate was then subjected to a second cure at 100° C. for 30 minutes; and a third cure at 360° C. for about 4 hours, to the form a polyimide conformational coating 34.

Vias 38 were defined in the polyimide conformational coating 34 by laser ablation by sweeping a shaped laser beam from an excimer laser emitting at 308 nm wavelength, through artwork, to ablate vias 38 in the polyimide conformational coating 34. The polyimide debris produced by the ablation was then removed by rinsing with potassium permanganate solution.

Metallization was then applied by sputtering a layer of chromium followed by a layer of copper followed by a layer of chromium. Subtractive etching was used to define the metallization; a photoresist Waycoat SC-1000, was applied, exposed through artwork and developed with xylene. The chromium was then etched using conventional processes with an alkaline potassium permanganate etchant, and the copper was etched with a ferric chloride-hydrochloric acid etchant, to define the circuitry 40, and the photoresist was stripped, to provide a carriers having minimum line widths of from 0.7 to 1.0 mil, with minimum spacing between lines of about 1.1 to 1.5 mil.

Chips 42 were then attached to the carrier 10 at temperatures of about 350° to 400° C., using solder reflow techniques. The carrier was then attached to the substructure 46.

EXAMPLE 2

Polyimide coated polytetrafluoroethylene carriers were prepared as in Example 1, except that a photosensitive polyimide, Ultradel 5106, from Amoco Chemical Company was used as the conformational coating 34. The photosensitive polyimide was screen coated and drawn down, then, instead of forming the vias 38 by laser ablation, the vias 38 were formed by photoimaging the photosensitive polyimide conformational coating 34. Conventional photoimaging techniques were performed by exposing the polyimide conformational coating 34 to ultraviolet light at 365 to 436 nm, then the polyimide conformational coating 34 was developed with a commercial developer, Ultradel D760 from Amoco Chemical Company, which contains a mixture of in n-methylpyrillidone and g-butyrolactone. The carrier 10 was then rinsed and cured as in Example 1.

The carriers were then evaluated. The HAST (highly accelerated stress test) was then conducted; no corrosion was observed in the metallized carriers. Migration testing, a biased test in which voltage applied across pairs of conductors, was also conducted. No significant change in resistance was detected indicating no migration. Attempts to determine the adhesion of the polyimide conformational coating to the filled polytetrafluoroethylene layer resulted in the cohesive failure of the polytetrafluoroethylene layer; that is, the failure was a cohesive, rather than adhesive failure.

The polyimide conformational coating and the circuitization of the carrier was visually examined under a light microscope at a magnification of 7x, (and up to 30x to confirm, where required) after each processing stage in which heat was employed; a uniform surface without voids was observed indicating little or no moisture absorption. The lines displayed minimal undercutting and no shorts between lines. Adhesion tests indicated that the layers stayed together through processing and that the chips adhered to the carrier.

Although several embodiments of this invention has been shown and described, various adaptations and modifications can be made without departing from the scope of the invention as defined in the appended claims.

Having described the invention, it is now claimed as follows:

1. An organic chip carrier comprising:
   a. a dielectric layer having a dielectric constant of from about 1.5 to 3.5;
   b. a first layer of circuitry disposed on and adhering to the dielectric layer;
   c. a conformational coating having a percent planarization of greater than about 30% and a dielectric constant of from about 1.5 to about 3.5, disposed on the first layer of circuitry and the dielectric layer;
   d. a second layer of circuitry disposed on the conformational coating, comprising lines having a line width less than 1 mil and line spacing of 1.5 mil or less; and
   e. at least one conductive via disposed through the conformational coating to connect the first layer of circuitry and the second layer of circuitry.

2. The carrier of claim 1 wherein the conformational coating is a polyimide.

3. The carrier of claim 1 wherein the dielectric layer is polytetrafluoroethylene.

4. The carrier of claim 1, wherein the dielectric layer characterized in being filled with particulate filler and free of woven fiberglass cloth.

5. The carrier of claim 1, wherein the conformational coating is a polyimide, and dielectric layer is polytetrafluoroethylene.

6. The carrier of claim 1, further comprising:
   at least one through hole disposed through the dielectric layer;
   at least one pad, disposed atop the through hole, in electrical and mechanical connection with the via.

7. An organic chip carrier comprising:
   a compensator;
   a first inner dielectric layer disposed on one side of the compensator;

a second inner dielectric layer disposed on the other side of compensator;

a first ground plane disposed on the first inner dielectric layer;

a second ground plane disposed on the second inner dielectric layer;

a second dielectric layer disposed on the second ground plane, having a dielectric constant of from about 1.5 to 3.5;

a first layer of circuitry disposed on and adhering to the second dielectric layer;

a conformational coating having a percent planarization of greater than about 30% and a dielectric constant of from about 1.5 to about 3.5, disposed on the first layer of circuitry and the second dielectric layer;

a second layer of circuitry disposed on the conformational coating, comprising lines having a line width less than 1 mil and line spacing of 1.5 mil or less;

at least one conductive via disposed through the conformational coating connecting the second layer of circuitry to the first layer of circuitry.

8. The carrier of claim 7, further comprising: at least one through hole disposed through the second dielectric layer;

at least one pad, disposed atop the through hole;

at least one conductive via disposed through the conformational coating, in electrical and mechanical connection with the pads.

9. The carrier of claim 7, wherein the dielectric layer is polytetrafluoroethylene.

10. The carrier of claim 9, wherein the polytetrafluoroethylene contains a silica filler.

11. The carrier of claim 7, wherein there is a plurality of pads and vias and the pad diameter exceeds the via diameter.

12. The carrier of claim 7, wherein the second dielectric layer is free of fiber glass.

13. The carrier of claim 7, wherein the conformational coating is a polyimide.

14. The carrier of claim 7, wherein the dielectric layer is free of fiber glass.

15. A circuitized structure comprising:

a. a circuitized substrate; and b. a carrier, electrically and mechanically connected to the substrate, comprising:

a dielectric layer;

at least one through hole disposed in the dielectric layer;

a pad disposed atop the through hole;

a conformational coating having a percent planarization greater than 30% disposed on the dielectric layer;

fine line circuitry comprising lines having a line width less than 1 mil and line spacing of 1.5 mil or less, disposed in the conformational coating;

at least one conductive via disposed through the dielectric layer and positioned over the pad;

c. a chip, disposed on the carrier and electrically and mechanically connected to the fine line circuitry.

16. The circuitized structure of claim 15, wherein the conformational coating is a polyimide.

17. The circuitized structure of claim 15, wherein the first dielectric layer is polytetrafluoroethylene.

18. The circuitized structure of claim 15, further comprising a layer of circuitry disposed on the dielectric layer.

19. A circuitized structure comprising:

a. a carrier comprising:

a dielectric layer;

at least one through hole disposed in the dielectric layer;

a pad disposed atop the through hole;

a conformational coating having a percent planarization greater than 30% disposed on the dielectric layer;

fine line circuitry comprising lines having a line width less than 1 mil and line spacing of 1.5 mil or less, disposed on the conformational coating;

at least one via disposed through the dielectric layer and positioned over the pad;

b. a chip, disposed on the carrier and electrically and mechanical connected to the fine line circuitry.

20. The circuitized structure of claim 19, wherein the conformational coating is a polyimide.

21. The circuitized structure of claim 19, wherein the first dielectric layer is polytetrafluoroethylene.

22. The circuitized structure of claim 19, further comprising a layer of circuitry disposed on the dielectric layer.

* * * * *

UNITED STATES PATENT AND TRADEMARK OFFICE
CERTIFICATE OF CORRECTION

PATENT NO. : 5,798,563
DATED : Aug. 25, 1998
INVENTOR(S) : Feilchenfeld et al.

It is certified that error appears in the above-identified patent and that said Letters Patent is hereby corrected as shown below:

In the Abstract: line 13, change 3.5% to 30%.

Signed and Sealed this

Nineteenth Day of January, 1999

Attest:

*Acting Commissioner of Patents and Trademarks*

Attesting Officer